US010470324B2

(12) United States Patent
Blersch

(10) Patent No.: US 10,470,324 B2
(45) Date of Patent: Nov. 5, 2019

(54) SECURING FRAME FOR A USB CONNECTOR

(71) Applicant: E.E.P.D.—Electronic-Equipment-Produktion & Distribution GmbH, Weichs (DE)

(72) Inventor: Christian Blersch, Weichs (DE)

(73) Assignee: E.E.P.D.—ELECTRONIC-EQUIPMENT-PRODUKTION & DISTRIBUTION GMBH, Weichs (DE)

( * ) Notice: Subject to any disclaimer, the term of this patent is extended or adjusted under 35 U.S.C. 154(b) by 0 days.

(21) Appl. No.: 15/749,482

(22) PCT Filed: Aug. 10, 2016

(86) PCT No.: PCT/EP2016/069003
§ 371 (c)(1),
(2) Date: Jan. 31, 2018

(87) PCT Pub. No.: WO2017/025548
PCT Pub. Date: Feb. 16, 2017

(65) Prior Publication Data
US 2018/0228042 A1    Aug. 9, 2018

(30) Foreign Application Priority Data
Oct. 8, 2015   (DE) .................. 10 2015 113 114

(51) Int. Cl.
*H05K 5/02*        (2006.01)
*H01R 13/639*      (2006.01)
*H01R 31/06*       (2006.01)

(52) U.S. Cl.
CPC ....... *H05K 5/0278* (2013.01); *H01R 13/6395* (2013.01); *H01R 31/065* (2013.01); *H05K 5/0286* (2013.01)

(58) Field of Classification Search
CPC .. H01R 13/6395; H01R 24/64; H01R 13/518; H01R 13/6271; H01R 13/629;
(Continued)

(56) References Cited

U.S. PATENT DOCUMENTS 6,141,221 A    10/2000  Tong et al.
6,305,986 B1 * 10/2001  Hwang ............. H01R 13/6485
                                               439/358
(Continued)

FOREIGN PATENT DOCUMENTS

CN      102237611 A    11/2011
DE   202010008835 U1    1/2011
(Continued)

OTHER PUBLICATIONS

International Search Report issued in International Application No. PCT/EP2016/069003, dated Nov. 7, 2016, 3 pages.

*Primary Examiner* — James Harvey
*Assistant Examiner* — Matthew T Dzierzynski
(74) *Attorney, Agent, or Firm* — Miller Nash Graham & Dunn LLP

(57) ABSTRACT

The invention relates to a securing frame (200, 400) for a USB connection (120), which USB connection is provided in a housing (110) of an electronic device (100), wherein the securing frame (200, 400) comprises means for attaching to the electronic device and comprises at least one protective wall segment (220a-220c; 420a-420h, 430), which is designed to extend at least partially away from the housing (110) when the securing frame (200, 400) is attached to the electronic device (100) near the USB connection (120). The invention further relates to a USB distributor (500) having such a securing frame (400) and to a connector module (300) for use with such a securing frame (200, 400).

15 Claims, 7 Drawing Sheets

(58) Field of Classification Search
CPC ............ H01R 13/6335; H01R 2107/00; H01R 25/006; H01R 43/26; H01R 13/514; H01R 13/5804; H01R 13/743; H01R 13/502; H01R 13/506
See application file for complete search history.

(56) References Cited

U.S. PATENT DOCUMENTS

| | | | | |
|---|---|---|---|---|
| 6,435,904 | B1* | 8/2002 | Herbst | H01R 13/6315 |
| | | | | 439/534 |
| 6,494,735 | B1* | 12/2002 | Chen | H01R 13/629 |
| | | | | 439/359 |
| 6,547,585 | B2* | 4/2003 | Bradley | H01R 13/633 |
| | | | | 439/353 |
| 6,796,844 | B1 | 9/2004 | Edwards, III | |
| 6,857,900 | B2* | 2/2005 | Kleeberger | H01R 13/6215 |
| | | | | 385/76 |
| 7,140,903 | B2* | 11/2006 | Pulizzi | H01R 13/5804 |
| | | | | 439/371 |
| 7,140,911 | B1* | 11/2006 | Rector | H01R 13/518 |
| | | | | 439/540.1 |
| 7,374,447 | B2* | 5/2008 | Matsumoto | H01R 13/518 |
| | | | | 439/344 |
| 7,384,304 | B1 | 6/2008 | Fawcett | |
| 7,470,148 | B1 | 12/2008 | Su et al. | |
| 7,559,788 | B2* | 7/2009 | Legg | H01R 13/6395 |
| | | | | 439/371 |
| 7,641,501 | B2* | 1/2010 | Uchikawa | H01R 13/6395 |
| | | | | 439/362 |
| 7,985,091 | B1* | 7/2011 | Fu | H01R 31/06 |
| | | | | 439/345 |
| 8,305,750 | B2 | 11/2012 | Hsieh | |
| 8,506,320 | B1* | 8/2013 | Fu | H01R 13/6395 |
| | | | | 361/679.4 |
| 8,547,691 | B2* | 10/2013 | Peng | H01R 13/6395 |
| | | | | 361/679.4 |
| 9,166,337 | B2 | 10/2015 | Boswell et al. | |
| 9,293,862 | B2* | 3/2016 | Fransen | H01R 13/518 |
| 10,038,273 | B2* | 7/2018 | Wojcik | H01R 13/506 |
| 2001/0047441 | A1 | 11/2001 | Robertson | |
| 2001/0053626 | A1 | 12/2001 | Wakino | |
| 2003/0008554 | A1* | 1/2003 | Chang | H01R 13/516 |
| | | | | 439/544 |
| 2006/0046557 | A1 | 3/2006 | Pulizzi et al. | |
| 2008/0299824 | A1 | 12/2008 | Legg | |
| 2009/0149055 | A1 | 6/2009 | Uchikawa et al. | |
| 2010/0060533 | A1 | 3/2010 | Chen | |
| 2012/0140398 | A1 | 6/2012 | Fu et al. | |

FOREIGN PATENT DOCUMENTS

| | | |
|---|---|---|
| DE | 102013020487 A1 | 6/2014 |
| EP | 1791255 A1 | 5/2007 |
| KR | 2020090006827 U | 7/2009 |

* cited by examiner

SECURING FRAME FOR A USB CONNECTOR

CROSS-REFERENCE TO RELATED APPLICATIONS

This application is a national stage filing under 35 U.S.C. § 371 of International Application No. PCT/EP2016/069003, filed Aug. 10, 2016, entitled SECURING FRAME FOR A USB CONNECTOR, and claims priority from German Patent Application No. 10 2015 113 114.5, filed Aug. 10, 2015, the disclosures of both of which are incorporated herein by reference in their entirety.

BACKGROUND OF THE INVENTION

This invention relates to a securing frame for a USB connector, a USB distributor (USB hub) having such a securing frame and a connector module designed for use with such a USB connector.

The Universal Serial Bus (USB) is a serial bus system for connecting a computer to external devices. Devices or memory media such as USB memory sticks equipped with USB connectors can be connected to one another during ongoing operation (Hot Swapping) and connected devices and their properties automatically recognised.

USB is suitable for many devices such as mass storage (such as hard drives, diskettes, DVD drives, memory sticks), printers, scanners, webcams, mice, keyboards, loudspeakers, dongles, graphics cards, monitors, etc. A USB connector can also take over the power supply for devices having a low power consumption, such as mice, for example.

As a result of this versatility and the high data transmission rate that can be achieved, USB connectors are therefore widely used for both personal and industrial PCs these days.

However, the mechanical strength of the connection established by a USB connector, i.e. the connection of a USB plug to a USB socket, is often not very high. Especially in the industrial sector where changes are frequently made to the connections of a PC, the problem that therefore regularly occurs in practice is that a USB connection is unintentionally disconnected, for example because a user accidentally trips on a cable and thus pulls a USB plug out of its allocated USB socket on a housing of an electronic device.

The objective of this invention, therefore, is to propose a device by means of which a USB housing connector provided on a housing of an electronic device can largely be secured to prevent a USB complementary connector that is to be connected from being unintentionally pulled out.

SUMMARY OF THE INVENTION

In accordance with the invention, this objective is achieved by a securing frame for a USB housing connector provided on a housing of an electronic device, which securing frame comprises means for attaching to the electronic device and at least one protective wall segment which is designed to extend at least partially away from the housing when the securing frame is attached to the electronic device near the USB housing connector.

During operation of the electronic device with a peripheral device connected to the USB housing connector, the protective wall segment of the securing frame then shields the USB complementary connector plugged into the USB housing connector and running to the peripheral device from mechanical effects. If the user happens to bang against the protective wall segment when working on the corresponding housing region of the electronic device, a direct mechanical effect on the USB complementary connector is ruled out however.

To this end, the means for attaching the securing frame to the electronic device expediently comprise at least one bore for a screw connection. In this manner, the securing frame can be attached in a stable fashion to the electronic device, which must have a thread for the screw connection for this purpose, so as to prevent the protective wall segment from being accidentally pushed away out of the vicinity of the USB housing connector.

Based on a simple variant of the invention, the securing frame may support a single, in particular straight, protective wall segment so that the USB housing connector is protected from mechanical effects from a predefined direction. However, the securing frame preferably comprises a plurality of mutually connected protective wall segments which are designed to surround the USB housing connector in a substantially U-shaped arrangement when the securing frame is attached to the electronic device. In this manner, the USB housing connector is protected from mechanical effects from the plurality of spatial directions but remains accessible at the open end of the "U" to enable the USB complementary connector to be intentionally plugged in or disconnected.

Above all in the industrial sector, there are still a large number of electrical and electronic apparatuses which are activated via an RS232 interface or another non-USB interface. An adapter, for example a USB-RS232 adapter, is therefore needed in order to establish a connection to the electronic device in question which has the USB housing connector on its housing. Based on another feature of the preferred variant of the invention having several mutually connected protective wall segments that is particularly suitable for this purpose, therefore, at least one of the protective wall segments has a guide rail for engaging in a groove in a housing of a connector module which comprises a USB complementary connector at one end. This connector module then contains the requisite adapter and has the other necessary connector, e.g. RS232 connector, at its end lying opposite the USB complementary connector. Due to the mutual engagement of the guide rail on the at least one protective wall segment and the groove in the housing of the connector module, the stability and reliability of the mechanical connection of the USB connector is further improved.

Numerous electronic devices provide a mount on their housing for not just a single but several USB housing connectors, which are usually disposed adjacent to one another. In principle, it is conceivable to protect only one of them by means of a securing frame based on the invention, for example a particularly important USB housing connector. However, the securing frame proposed by the invention expediently has a plurality of mutually spaced protective wall segments which are assigned to a plurality of mutually adjacent USB housing connectors when the securing frame is attached to the electronic device.

If the securing frame proposed by the invention has, for example, at least three protective wall segments which are oriented parallel with one another at equal distances, two adjacent USB housing connectors can be shielded from both the outside and one another by a protective wall segment respectively.

In this embodiment having a plurality of mutually spaced protective wall segments, the securing frame proposed by the invention may comprise a plate in particular, which comprises the means for attaching to the electronic device and a plurality of walls which are secured to the plate or are integrally formed therewith, and the plate and/or at least one of the walls comprises the at least one protective wall segment. When the securing frame has been secured to the electronic device, this plate expediently extends substantially parallel with the USB housing connectors and the walls expediently extend orthogonally from the plate between the USB housing connectors and on the external faces thereof.

In the variants described above, the invention relates to purely mechanical components with which separate electronic devices can be equipped or subsequently extended in order to increase the stability of the connection of USB housing connectors of these electronic devices.

Based on another feature, the invention also relates to a USB distributor, comprising:
  a securing frame based on the invention, as described above;
  a USB complementary connector attached to the securing frame for connecting to a USB housing connector provided in a housing of an electronic device; and
  a plurality of USB connectors secured to the securing frame and connected to the USB complementary connector, at least one of the USB connectors being disposed between adjacent protective wall segments of the securing frame.

Based on this additional feature, the invention therefore enables an initially unsecured USB housing connector of an electronic device to distribute to a plurality of secured USB connectors of the securing frame itself and thus serves as a USB hub.

In this respect, each of the plurality of USB connectors is preferably disposed between adjacent protective wall segments of the securing frame so that each of the USB connectors is protected from being unintentionally pulled out of an allocated USB complementary connector.

In principle, the term "connector" includes both a socket and a plug and the term "complementary connector" comprises a plug and/or socket accordingly. Since electronic devices are equipped with sockets on their housing as a rule, the USB housing connector of a USB distributor based on the invention is expediently a USB socket, the USB complementary connector is a USB plug and at least one of the USB connectors is a USB socket.

The invention further relates to a connector module for use in a securing frame based on one of the variants described above having a plurality of mutually connected protective wall segments, comprising:
  a connector module housing with electronic components accommodated therein, a width of the connector module housing corresponding to a spacing of adjacent protective wall segments; and
  a USB complementary connector connected to the electronic components and provided on a first end wall of the connector module housing.

Since the width of the connector module housing corresponds to a spacing of adjacent protective wall segments, the connector module based on the invention can be pushed into the securing frame proposed by the invention with a tight fit, which further increases the stability of the connection between the USB connector of the electronic device and the USB complementary connector compared with the known situation of cooperation with a standard USB complementary connector.

A further improvement in the stability of this connection can be obtained if the connector module also comprises a groove provided in a side wall of the connector module housing for engaging with the guide rail of the at least one protective wall segment.

The USB complementary connector provided on the first end wall of the connector module proposed by the invention may be the sole external connector of the connector module if, for example, the electronic components accommodated therein constitute a USB memory stick, a modem, etc. Alternatively, the connector module proposed by the invention may also have a non-USB connector connected to the electronic components and projecting out from a second end wall lying opposite the first end wall or from a side wall, in particular an RS232 connector. The connector module is then used to connect the electronic device in question to a peripheral device via a non-USB connector.

Based on another feature, a side wall of the connector module housing has a clamping mechanism for mounting on a mounting rail, in particular a top hat rail. Such a connector module can therefore not only be pushed into a securing frame proposed by the invention but can also be mounted on a standard top hat rail and can therefore be used with particular versatility.

For applications which require a particularly strong and reliable connection of the USB connector, the connector module proposed by the invention may also have an orifice in the vicinity of the first end wall for connecting to the electronic device, in particular by inserting a screw connector or plug connector in the orifice. In this manner, the connector module can be doubly secured on the electronic device, namely by the tight fit in the securing frame attached to the electronic device on the one hand and by the connection to the electronic device on the other hand.

The invention further relates to a connector module, in particular for use in a securing frame based on one of the variants described above having a plurality of mutually connected protective wall segments, comprising a connector module housing comprising two mutually connected housing parts which have at least one pin projecting into the interior of the connector module housing and a board disposed in the connector module housing which has at least one bore for receiving the at least one pin, and the board or an electronic component secured to the board preferably also has at least one contact surface which sits in contact with at least one of the mutually connected housing parts.

By contrast with conventional connector modules, the board is then not screwed into the connector module housing but is guided into it with the aid of the at least one pin and bore and firmly clamped by the co-operation of the contact surface with the at least one housing part. This enables the board and housing to be assembled and dismantled rapidly.

BRIEF DESCRIPTION OF THE DRAWINGS

Preferred embodiments of the invention will be explained below on the basis of non-restrictive examples with reference to the appended drawings. Of these.

DETAILED DESCRIPTION

Figure 1:
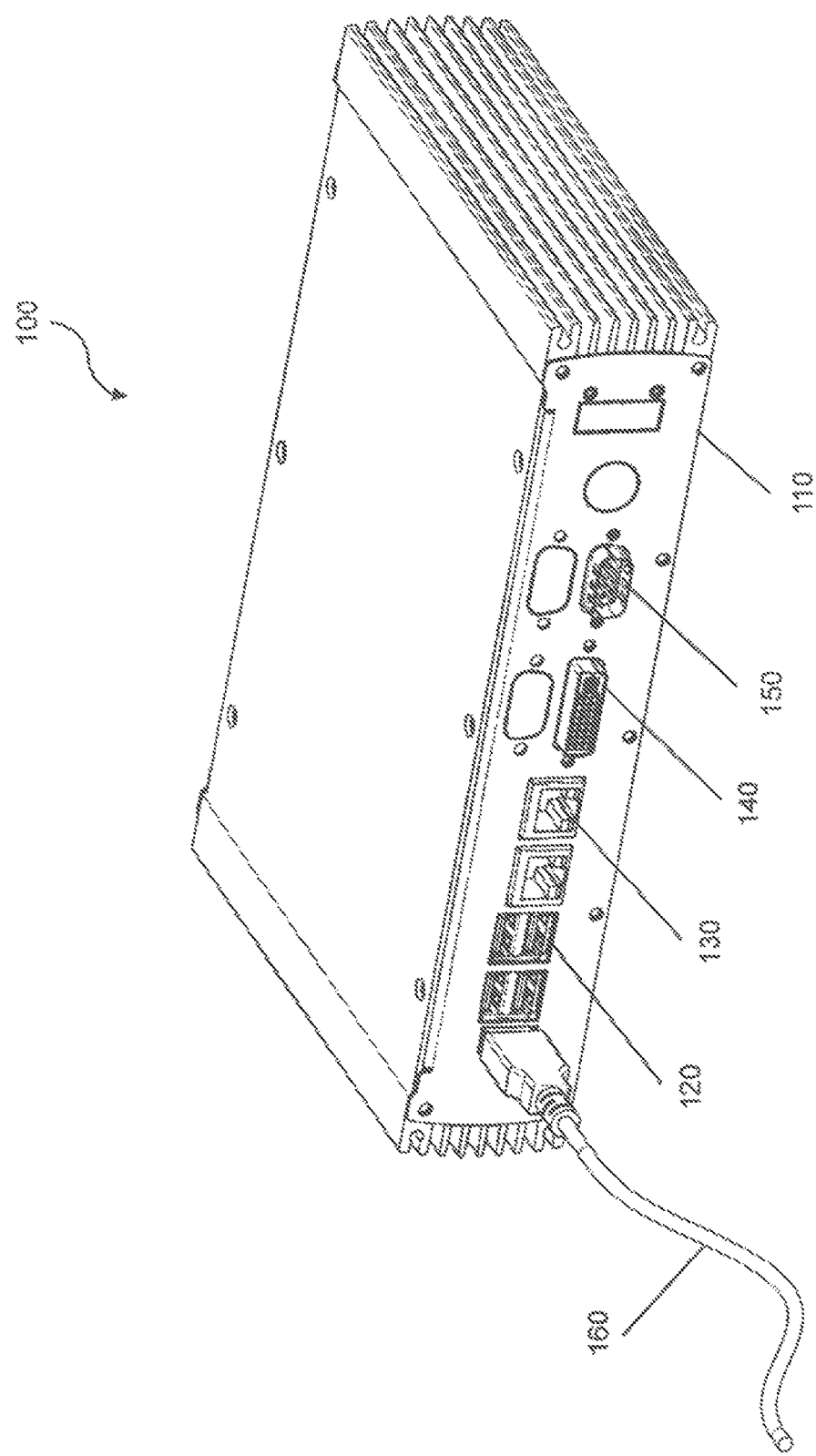
FIG. 1 is a perspective view of the rear face of an industrial PC 100 with a USB housing connector.

FIG. 1 is a perspective view of the rear face of an industrial PC 100 with a USB housing connector. An industrial PC is generally a computer which is used for tasks in the industrial sector. However, the industrial PC 100 illustrated in FIG. 1 is just one example of an electronic device with which the securing frame proposed by the invention can be used. Other examples of such electronic devices comprise personal computers, server computers, routers and Wireless Access Points, provided they have at least one USB housing connector.

The industrial PC 100 illustrated in FIG. 1 comprises a housing 110, on the rear face of which one or more connectors are provided. The connectors of the industrial PC 100 comprise several USB connectors 120 (hereafter referred to as USB housing connectors), two network connectors 130, a digital video connector (e.g. Digital Visual Interface, DVI) 140 and a non-USB connector 150, in particular an RS232 connector. Furthermore, the industrial PC 100 is connected by means of a USB connector cable 160 via one of the USB housing connectors 120 to a peripheral device (not illustrated).

Figure 2:
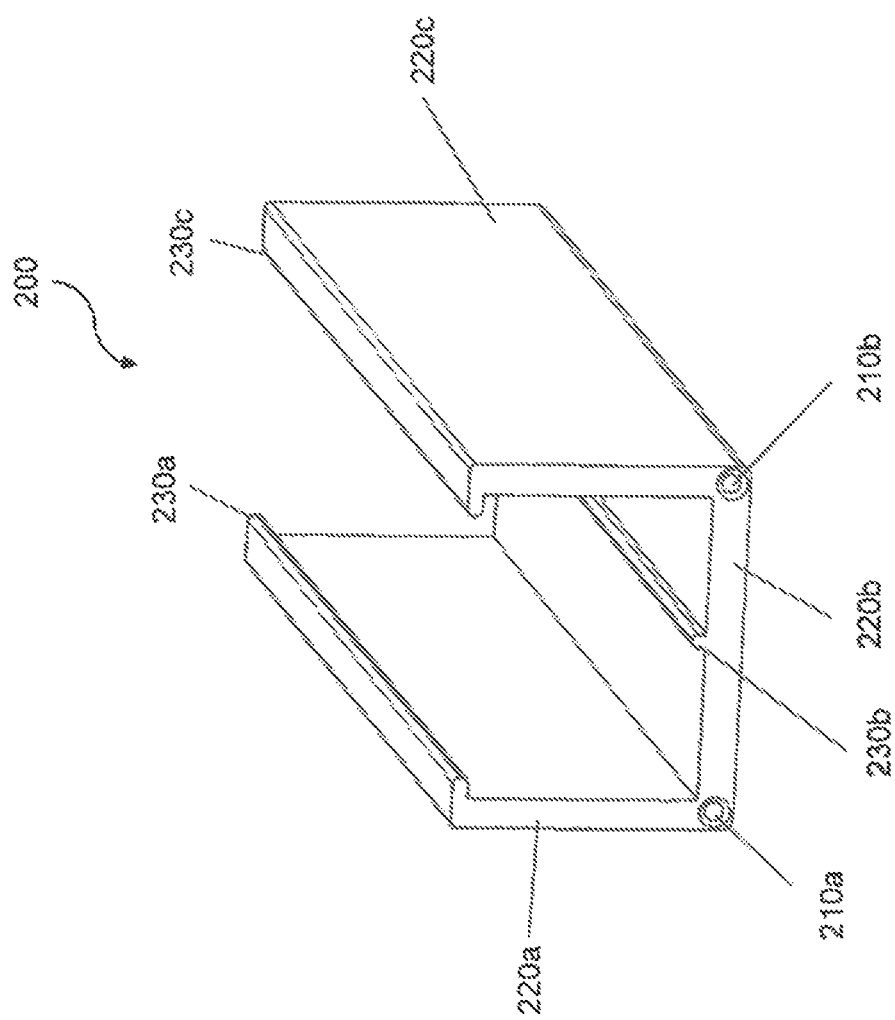
FIG. 2 is a perspective view of a securing frame 200 for a USB housing connector provided on a housing of an electronic device based on one exemplary embodiment of this invention.

A securing frame 200 based on one exemplary embodiment of this invention will be described below with reference to FIG. 2. FIG. 2 is a perspective view of the securing frame 200.

The securing frame 200 is provided as a means of attaching to a USB housing connector provided on a housing of an electronic device. In particular, the securing frame 200 can be attached to the housing 110 of the industrial PC 100 of FIG. 1 in the vicinity of one of the USB housing connectors 120.

The securing frame 200 comprises a plurality of protective wall segments 220a, 220b, 220c, which are connected to one another in such a way that they form a U-shape and which surround one of the USB housing connectors 120 from FIG. 1 in the attached state. To this end, one end of a first protective wall segment 220a forming a side wall segment of the U-shape is connected to one end of a second protective wall segment 220b forming a base segment of the U-shape, whereas the other end of the second protective wall segment 220b is connected to one end of a third protective wall segment 220c forming another side wall segment of the U-shape. Accordingly, the first and third protective wall segments 220a, 220c are substantially parallel with one another. Furthermore, the protective wall segments 220a, 220b, 220c are connected to one another in such a way that they each subtend a right angle. The other ends of the two protective wall segments 220a, 220c respectively lie free. The protective wall segments 220a, 220b, 220c of the securing frame 200 are integrally formed.

The spacing of the first and third protective wall segments 220a, 220c is selected so that it corresponds to a width of a connector module 300, as will be described with reference to FIG. 3. As a result, the connector module 300 can be pushed into the securing frame 200 with a tight fit, thereby further increasing the stability of the connection between the USB housing connector of the electronic device and the USB complementary connector 320 of the connector module 300.

The securing frame 200 further comprises two bores for screw connections 210a, 210b, which are provided in connection regions between the first and the second protective wall segment 220a, 220b and between the second and third protective wall segment 220b, 220c. By means of screw connections engaging in the bores 210a, 210b, the securing frame 200 is attached to the electronic device, e.g. the industrial PC 100 of FIG. 1, such that it extends away from it. The screw connections also guarantee a reliable attachment to the industrial PC 100 of FIG. 1.

The securing frame 200 further comprises guide rails 230a, 230b, 230c, provided respectively as a means of engaging in a groove of a housing of the connector module 300 described with reference to FIG. 3. To this end, the guide rails 230a, 230b, 230c are in particular of a shape and dimensions such that they correspond to the respective groove of the connector module 300 of FIG. 3.

The guide rails 230a, 230b, 230c of the securing frame 200 are formed by regions which project out from the surface of the respective protective wall segment 220a, 220b, 220c. In particular, the guide rails 230a, 230c of the protective wall segments 220a, 220c are provided respectively at the free ends thereof in such a way that they project out from the surfaces of the first and third protective wall segments 220a, 220c in opposite directions. The guide rail 230b is disposed centrally on the second protective wall segment 220b and projects in a direction disposed orthogonally to the directions in which the guide rails 230a, 230c project.

The guide rails 230a, 230b, 230c are formed integrally with the respective protective wall segment 220a, 220b, 220c.

A connector module 300 based on one exemplary embodiment of this invention which can be used with the securing frame 200 proposed by the invention and in particular can be pushed into the securing frame 200 will be described below with reference to FIG. 3.

The connector module 300 comprises a connector module housing 310 and a USB complementary connector 320, e.g. a USB plug, for connecting to the USB housing connector of the electronic device, e.g. one of the USB housing connectors 120 of the industrial PC 100 from FIG. 1. Accommodated in the connector module housing 310 of the connector module 300 are electronic components (illustrated in FIG. 6) which are connected to the USB complementary connector 320. The USB complementary connector 320 is provided on a first end wall 312 of the connector module housing 310.

The connector module housing 310 of the connector module 300 comprises two housing halves 310a, 310b which are connected to one another and the width of the connector module housing 310 corresponds to the spacing of the first and third protective wall segments 220a, 220c of FIG. 2. As a result, the connector module 300 can be pushed into the securing frame 200 of FIG. 2 with a tight fit.

Figure 3:
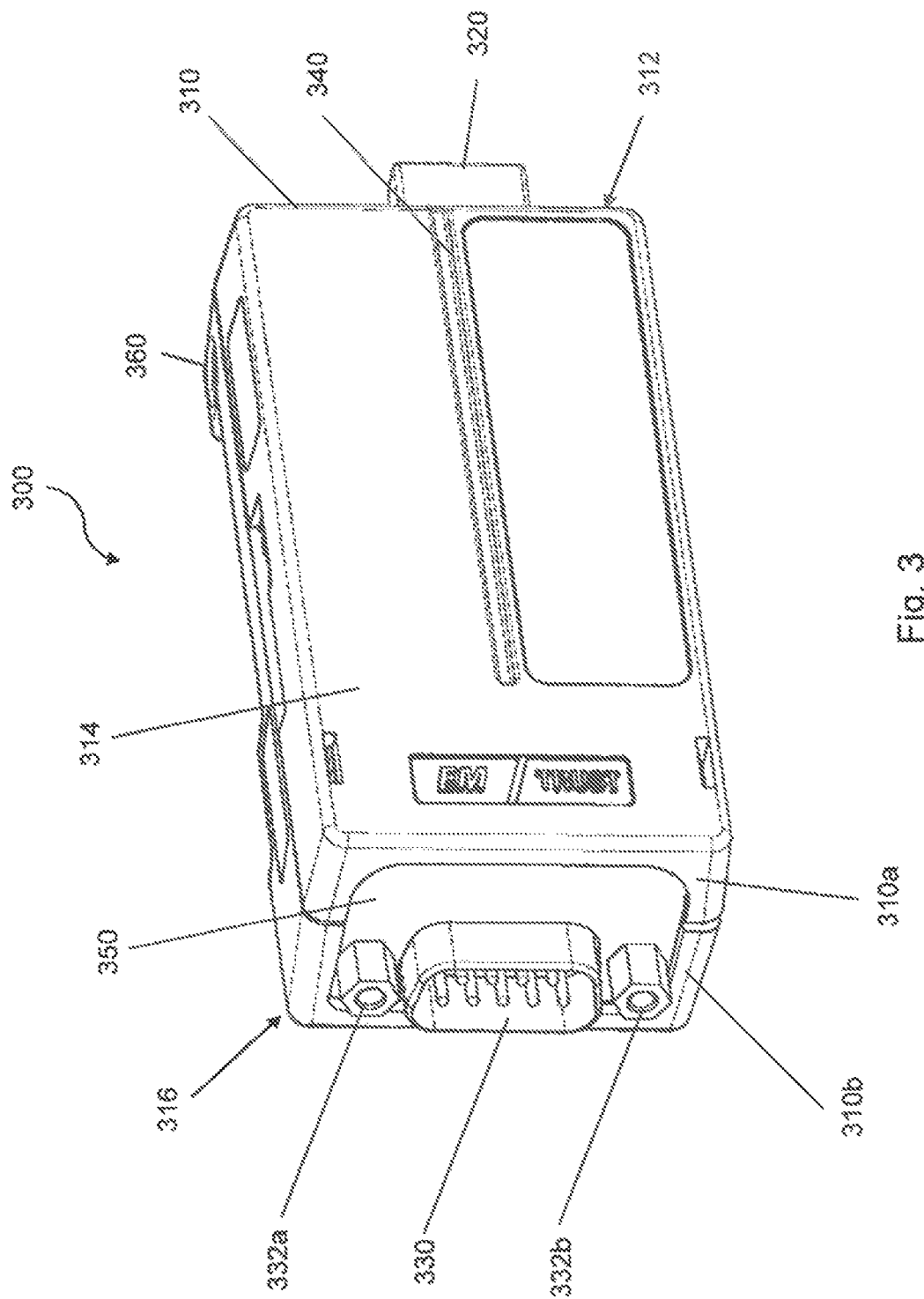
FIG. 3 is a perspective view of a connector module 300 based on one exemplary embodiment of this invention, which can be used in particular in a securing frame based on this invention.

In the exemplary embodiment of FIG. 3, the connector module 300 further comprises a groove 340 provided in a side wall 314 of the connector module housing 310. When the connector module 300 has been pushed into the securing frame 200 of FIG. 2, the groove 340 engages in the guide rail 230*a* of the protective wall segment 220*a*, for example.

The groove 340 is shaped so that it corresponds to the guide rail 230*a* of the protective wall segment 220*a* and establishes a positive connection with the guide rail 230*a* when the connector module 300 has been pushed into the securing frame 200. In FIG. 3, the groove 340 extends across only a part of the length of side wall 314 of the connector module housing 310; however, it could also extend across its entire length.

To enable the connector module 300 to be pushed into the securing frame 200 of FIG. 2, the connector module 300 has another groove (not illustrated) in addition to groove 340 in another side wall of the connector module housing 310 lying opposite side wall 314 for engaging with guide rail 230*c* of the protective wall segment 220*c*, and a groove (not illustrated) for engaging with guide rail 230*b* of the protective wall segment 220*b*.

The connector module 300 further comprises a non-USB connector 330, in the case illustrated an RS232 connector, on and projecting out from a second end wall 316 lying opposite the first end wall 312. The connector 330 is connected to the electronic components and via the latter also to the USB complementary connector 320. The connector module 300 illustrated in FIG. 3 is a USB to RS232 converter.

The RS232 connector 330 is mounted in an aperture 350 provided in the second end face 316 and secured by means of screw means 332*a*, 332*b*.

The connector module 300 further comprises an orifice 360 for providing a connection to the electronic device, in particular by means of a screw connection or plug connection. As illustrated in FIG. 3, the orifice 360 is provided in the vicinity of the first end wall 312.

Furthermore, the connector module 300 comprises a clamping mechanism (not illustrated), provided on the other side wall of the connector module housing 310. The clamping mechanism is provided as a means of mounting the connector module 300 on a mounting rail, in particular a top hat rail.

Figure 4:
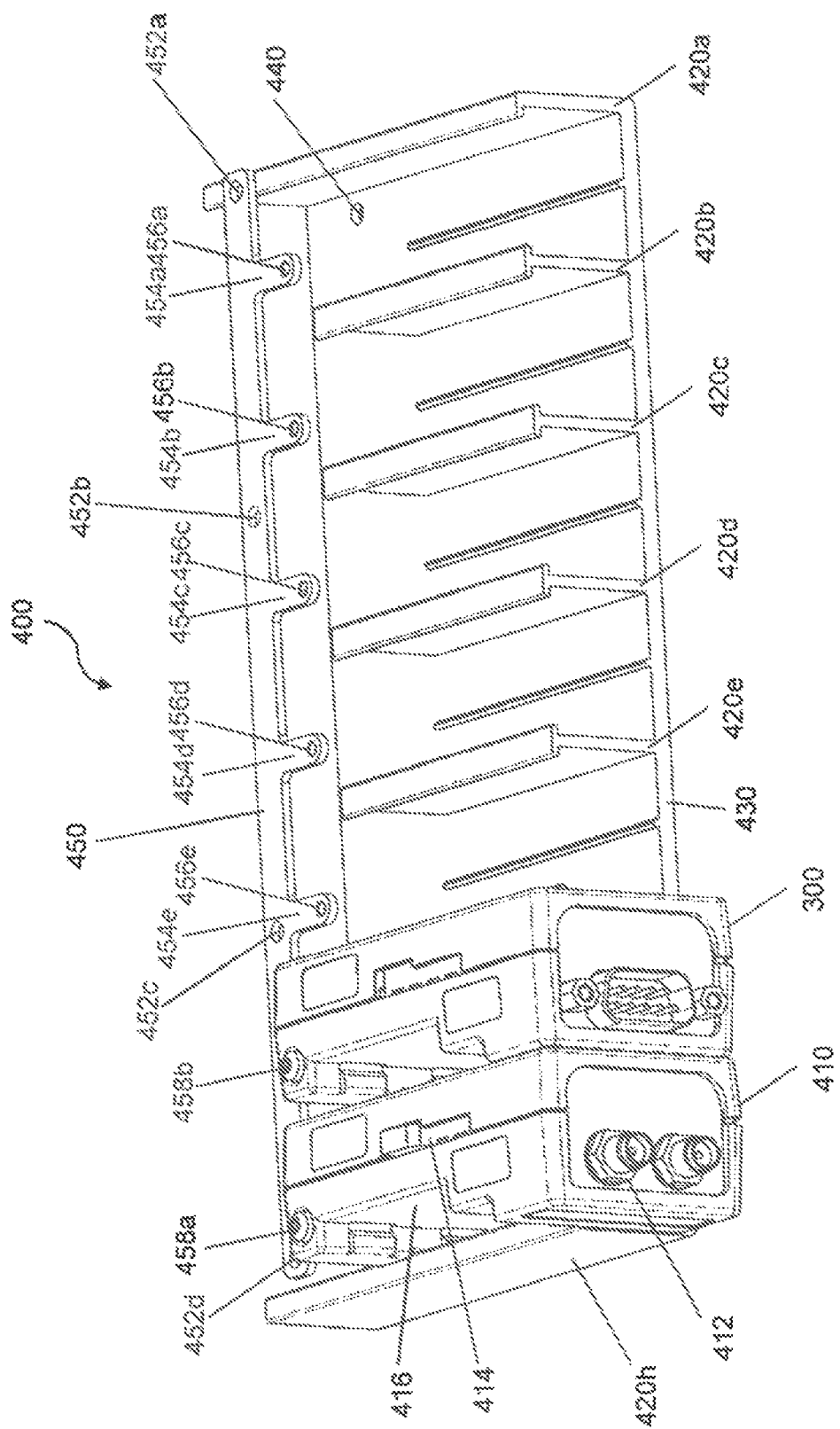
FIG. 4 is a perspective view of a securing frame 400 for a plurality of USB housing connectors provided on the housing of the electronic device based on another exemplary embodiment of this invention.

Another exemplary embodiment of a securing frame 400 based on this invention will be described below with reference to FIG. 4. FIG. 4 is a perspective view of the securing frame 400 for a plurality of USB housing connectors provided on the housing of the electronic device.

The securing frame 400 comprises a plate 430 and a plurality of mutually spaced protective wall segments 420*a*-420*h*, which are assigned to a plurality of adjacently disposed USB housing connectors when the securing frame 400 is attached to an electronic device. The protective wall segments 420*f* and 420*g* are hidden from view. The protective wall segments 420*a*-420*h* are oriented parallel with one another disposed at equal distances and are formed integrally with the plate 430.

The plate 430 further comprises means in the form of a bore for a screw connection 440 to provide a means of attachment to the electronic device.

In a direction in which a connector module is pushed into the securing frame 400, the outer protective wall segments 420*a*, 420*h* each have a length which substantially corresponds to the length of the plate 430. The other protective wall segments 420*b*-420*f*, on the other hand, have a length that is shorter than the length of the outer protective wall segments 420*a*, 420*h* and the plate 430.

In the attached state, the two outer protective wall segments 420*a*, 420*h* and a part of the plate 430 lie respectively on side walls of the housing of the electronic device and the securing frame 400 is secured to the housing of the electronic device by means of a screw connection through the bore 440. In the attached state, the protective wall segments 420*b*-420*f* are spaced at a distance apart from the rear face of the industrial PC 100 illustrated in FIG. 1 or lie against it.

FIG. 4 also illustrates two connector modules 300, 410 pushed into the securing frame 400. The connector module 300 in this instance corresponds to the connector module 300 illustrated in FIG. 3, the connector module 300 with the RS232 connector in the case illustrated. The connector module 410 is a connector module which—in terms of design—corresponds to connector module 300 illustrated in FIG. 3 but comprises a connector for an external antenna 412 as a non-USB connector and a slot for a SIM (Subscriber Identity Module) card. The connector module 410 is therefore a connector module 410 for use with a mobile radio standard, e.g. GSM (Global System for Mobile Communications). Like connector module 300, connector module 410 has the clamping mechanism 416 to provide a mounting on a mounting rail.

The securing frame 400 also has another plate 450 with means for attaching the securing frame 400 to the electronic device, in the case illustrated bores for screw connections 452*a*, 452*b*, 452*c*, 452*d*. The other plate 450 extends parallel with plate 430 and orthogonally to the protective wall segments 420*a*-420*h*. In the attached state, the other plate 450 is disposed parallel with the rear face of the electronic device.

The other plate 450 comprises a plurality of projections 454*a*-454*g* for securing the connector modules 410, 300 that have been pushed into the securing frame 400, projections 454*f*, 454*g* being hidden from view. In particular, the projections 454*a*-454*g* are designed so that they project out from the other plate 450 in the direction opposite that in which the connector modules 410, 300 are pushed into the securing frame 400. Furthermore, each of the projections 454*a*-454*g* comprises a bore provided with a thread for a screw connection 456*a*-456*g*, bores 456*f*, 456*g* being hidden from view.

Figure 5A:
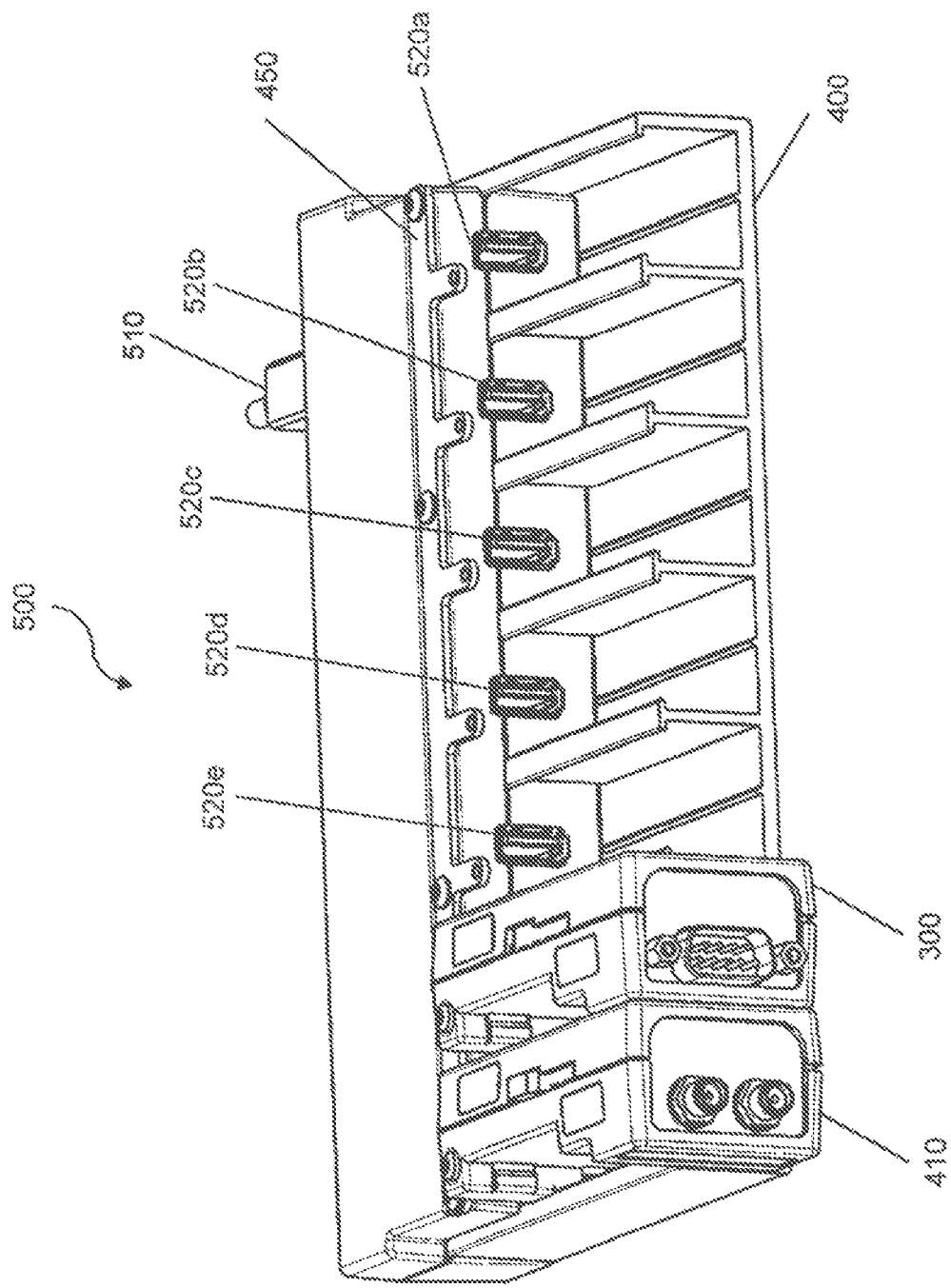
FIG. 5A is a perspective view of the rear face of a USB distributor 500 based on one exemplary embodiment of this invention.
Figure 5B:
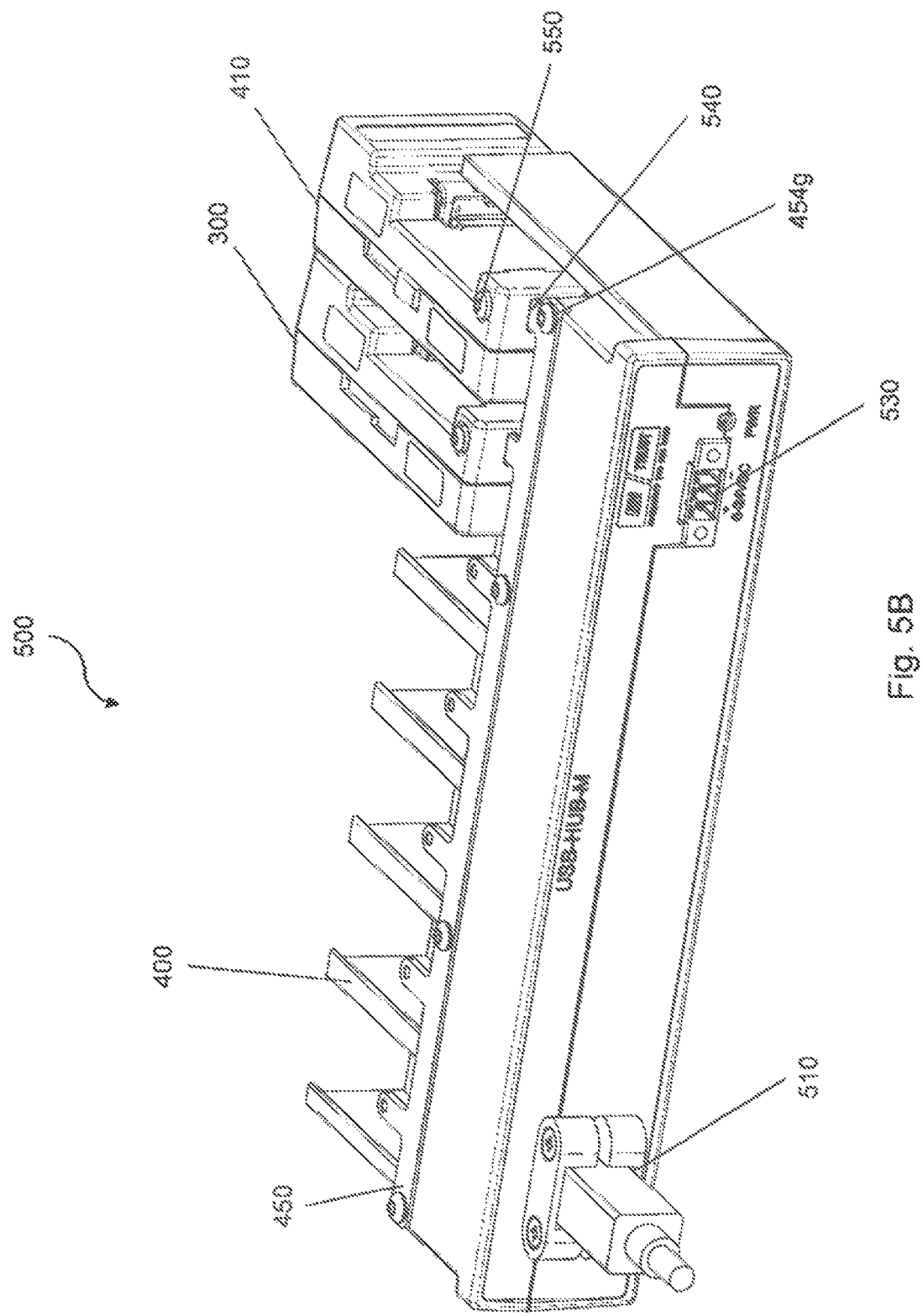
FIG. 5B is a perspective view of the front face of the USB distributor 500 from FIG. 5A.

The projections 454*a*-454*g* are provided so as to extend through corresponding orifices 540 into the interior of the connector module 410, 300, as illustrated in FIG. 5B.

The screw connections inserted through the orifice 360 of the respective connector module 410, 300 engage by means of a screw 458*a*, 458*b* in the respective thread of the bores 456*f*, 456*g*, thereby securing the connector modules 410, 300 to the securing frame 400 and/or the electronic device and in particular prevent any unintentional pulling out in the direction opposite that in which the connector modules 410, 300 are pushed into the securing frame 400.

In another embodiment illustrated in FIG. 4, the bores 456*a*-456*g* in the projections 454*a*-454*g* may also be designed without a thread and the screw 458*a*, 458*b* is replaced respectively by a pin provided as a means of locating in the bore. This being the case, the pin can also be inserted through the orifice 360 and biased in the direction of the bores in the projections by means of a spring. The connector module 410, 300 is secured on the securing frame 400 and/or the electronic device by pushing the connector module 410, 300 into the securing frame 400 by inserting (e.g. lifting) the pin in the direction opposite the biasing force until the projections 454*a*-454*g* extend through the corresponding orifices 540 into the interior of the connector module 410, 300 and then inserting (e.g. releasing) the pin in the direction of the biasing force so that the biased pin locates in the orifice 360 through to the respective bore 456a-456g and thus secures the connector module 410, 300 on the securing frame 400 and/or electronic device.

A USB distributor 500 (i.e. USB hub) based on one embodiment of this invention will be described below with reference to FIGS. 5A and 5B. FIG. 5A is a perspective view of the rear face of the USB distributor 500 and FIG. 5B is a perspective view of the front face of the USB distributor 500.

The USB distributor 500 comprises a securing frame 400, as illustrated in FIG. 4, a USB connector 510 (hereafter referred to as USB complementary connector) attached to the securing frame 400 for connecting to a USB housing connector provided in a housing of an electronic device and a plurality of USB connectors 520a-520g secured to the securing frame 400 and connected to the USB complementary connector 510, of which only USB connectors 520a-520e are free and USB connectors 520f, 520g are in use in FIG. 5A.

The securing frame 400 and the USB connectors 520a-520g are disposed on the rear face and the USB complementary connector 510 is disposed on the front face of the USB distributor 500.

The USB connectors 520a-520g are disposed so that they are each positioned between adjacent protective wall segments of the securing frame 400.

The securing frame 400 is also provided with the other plate 450 described above, which is attached to the USB distributor by means of screw connections.

FIGS. 5A and 5B illustrate two connector modules 410, 300 of the type illustrated in FIG. 4 pushed into the securing frame 400 of the USB distributor 500 at the USB connectors 520f, 520g.

As illustrated in FIG. 5B, the USB distributor 500 has a connector 530 on its front face for connecting to an external power supply (not illustrated), e.g. an external power adapter.

The projection 454g of the other plate 450 engages in an orifice 540 provided in the first end wall of the connector module 410 when the connector module 410 is pushed into the securing frame 400. The connector module 410 is secured by a screw connection by means of a screw 550 which is inserted in the orifice 260 in the connector module 410 illustrated in FIG. 3 and engages in the thread of the bore (not illustrated) in the projection 454g.

Figure 6:
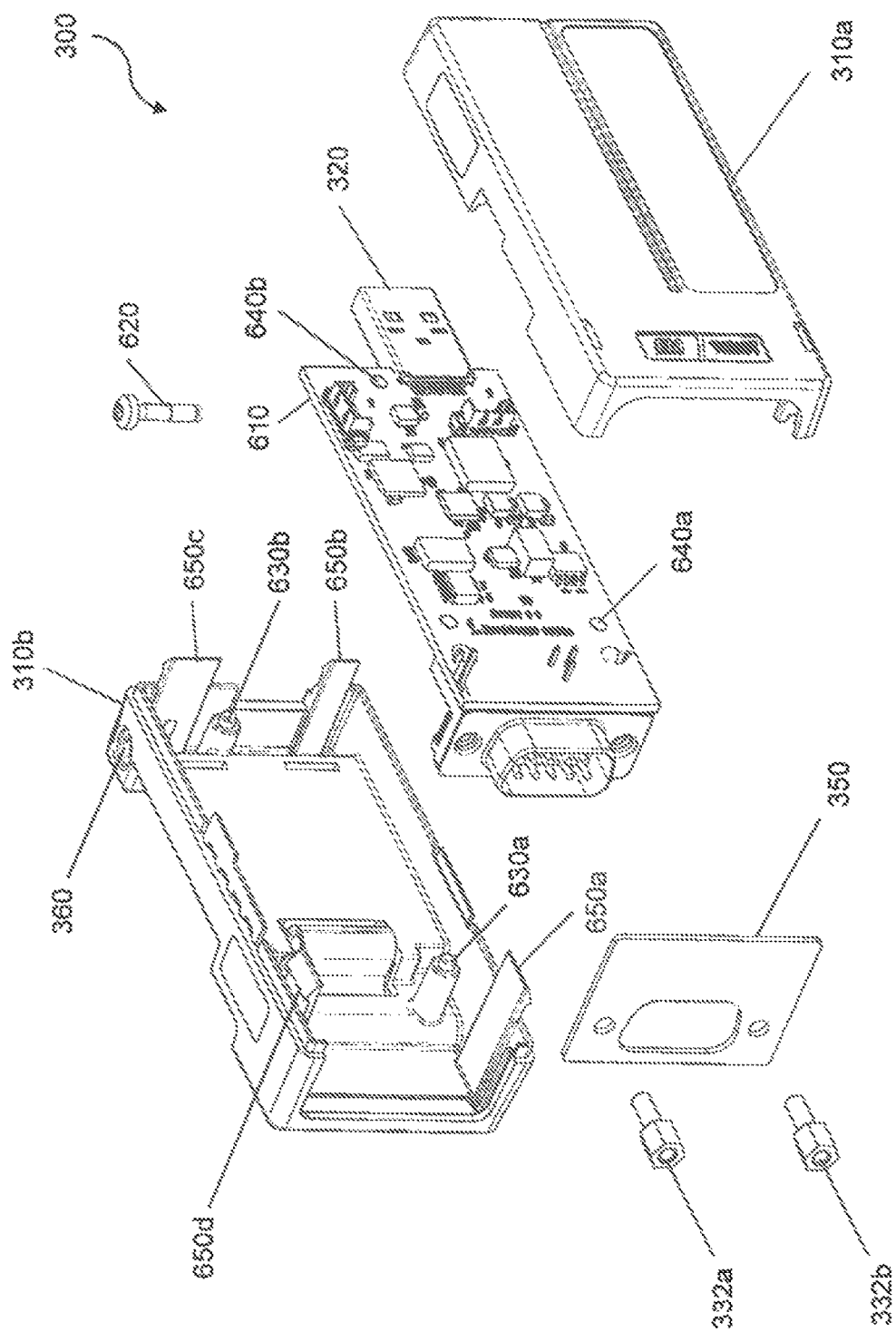
FIG. 6 is a perspective exploded view of the connector module 300 based on one exemplary embodiment of this invention.

FIG. 6 illustrates a perspective exploded view of the connector module 300 from FIG. 3. The connector module 300 is provided for use with the securing frame 200 illustrated in FIG. 2 and the securing frame 400 illustrated in FIG. 4, i.e. for insertion therein. The connector module housing 310 therefore has a width which corresponds to the spacing of adjacent protective wall segments.

The connector module 300 comprises a connector module housing 310 of the type illustrated in FIG. 3 comprising two mutually connected housing parts 310a, 310b, electronic components accommodated in the connector module housing 310 and a USB complementary connector 320 connected to the electronic components and provided on the first end wall of the connector module housing 310. The connector module 300 of FIG. 6 also has a non-USB connector 330, an RS232 connector in the case illustrated, which projects out from the second end wall.

The housing parts 310a, 310b of the connector module 300 have pins 630a, 630b projecting into the interior of the connector module housing 310. The electronic components are mounted on a board 510 disposed in the connector module housing 310. The board has bores 640a, 640b for receiving the pins 630a, 630b.

The board 610 or one of the electronic components mounted on the board 610 also has a contact surface (not illustrated) which sits in contact with at least one of the mutually connected housing parts 310a, 310b.

In the embodiment illustrated in FIG. 6, the housing parts 310a, 310b are detachably connected to one another using a snap-fit connection (in the case illustrated snap-in hooks 650a, 650b, 650c 650d provided on housing part 310b and undercuts provided on housing part 310a).

The connector module 300 comprises the orifice 360 for connecting to the electronic device or securing frame, e.g. using screw 620.

What is claimed is:

1. A securing frame for a USB housing connector of a housing of an electronic device, comprising:
    means for attaching to the electronic device; and
    a plurality of mutually connected protective wall segments arranged in a substantially U-shaped arrangement which surround the USB housing connector, the U-shaped arrangement having an open end when the securing frame is attached to the electronic device, the open end structured to allow a USB complementary connector to be connected or disconnected to the USB housing connector without removing the securing frame, and at least one protective wall segment extending at least partially away from the housing of the electronic device when the securing frame is attached to the electronic device near the USB housing connector;
    wherein at least one of the protective wall segments has a guide rail for engaging in a groove of a housing of a connector module which comprises the USB complementary connector at one end.

2. The securing frame as claimed in claim 1, wherein the means for attaching the securing frame to the electronic device comprise at least one bore for a screw connection.

3. The securing frame as claimed in claim 1, wherein the plurality of mutually connected protective wall segments include a plurality of mutually spaced protective wall segments assigned to a plurality of mutually adjacent USB housing connectors when the securing frame is attached to the electronic device.

4. The securing frame as claimed in claim 3, wherein the securing frame has at least three protective wall segments which are oriented parallel with one another at equal distances.

5. The securing frame as claimed in claim 3, in which the securing frame has a plate which comprises the means for attaching to the electronic device and a plurality of walls which are secured to the plate or are integrally formed therewith, and the plate and/or at least one of the walls comprises the at least one protective wall segment.

6. A USB distributor, comprising:
    a securing frame as claimed in claim 1;
    the USB complementary connector attached to the securing frame for connecting to the USB housing connector provided in the housing of the electronic device; and
    a plurality of the USB connectors secured to the securing frame and connected to the USB complementary connector, at least one of the USB connectors being disposed between adjacent protective wall segments of the securing frame.

7. The USB distributor as claimed in claim 6, wherein each of the plurality of USB connectors is disposed between adjacent protective wall segments of the securing frame.

8. The USB distributor as claimed in claim 6, wherein the USB housing connector is a USB socket, the USB complementary connector is a USB plug and at least one of the USB connectors is a USB socket.

9. A connector module for use in a securing frame as claimed in claim 1, comprising:
the connector module housing with electronic components accommodated therein, a width of the connector module housing corresponding to a spacing of adjacent protective wall segments; and
the USB complementary connector connected to the electronic components and provided on a first end wall of the connector module housing.

10. The connector module as claimed in claim 9, wherein the connector module further comprises the groove provided in a side wall of the connector module housing for engaging with the guide rail of the at least one protective wall segment.

11. The connector module as claimed in claim 9, wherein the connector module further comprises a non-USB connector connected to the electronic components and projecting out from a second end wall lying opposite the first end wall or from a side wall.

12. The connector module as claimed in claim 9, wherein a side wall of the connector module housing has a clamping mechanism for mounting on a mounting rail.

13. The connector module as claimed in claim 9, further comprising an orifice in the vicinity of the first end wall for connecting to the electronic device, in particular by inserting a screw connector or plug connector in the orifice.

14. The connector module as claimed in claim 9, comprising a connector module housing comprising two mutually connected housing parts which have at least one pin projecting into the interior of the connector module housing and a board disposed in the connector module housing which has at least one bore for receiving the at least one pin.

15. The connector module as claimed in claim 14, wherein the board
or an electronic component mounted on the board also has at least one contact surface which sits in contact with at least one of the mutually connected housing parts.

* * * * *

UNITED STATES PATENT AND TRADEMARK OFFICE
CERTIFICATE OF CORRECTION

PATENT NO.         : 10,470,324 B2
APPLICATION NO.    : 15/749482
DATED              : November 5, 2019
INVENTOR(S)        : Christian Blersch Page 1 of 1

It is certified that error appears in the above-identified patent and that said Letters Patent is hereby corrected as shown below:

On the Title Page

At "(30) Foreign Application Priority Data":
"October 8, 2015 (DE) .....................10 2015 113 114"
Should read:
--August 10, 2015 (DE) ....................10 2015 113 114--

Signed and Sealed this
Third Day of March, 2020

Andrei Iancu
*Director of the United States Patent and Trademark Office*